(12) United States Patent
Biro et al.

(10) Patent No.: US 8,043,946 B2
(45) Date of Patent: Oct. 25, 2011

(54) MIXTURE FOR DOPING SEMICONDUCTORS

(75) Inventors: Daniel Biro, Freiburg (DE); Catherine Voyer, Constance (DE); Harald Wanka, Blaustein (DE); Jörg Koriath, Blaubeuren (DE)

(73) Assignees: Centrotherm Photovoltaics AG, Blaubeuren (DE); Fraunhofer-Gesellschaft zur Forderung der Angewandten Forschung E.V., Munich (DE)

( * ) Notice: Subject to any disclaimer, the term of this patent is extended or adjusted under 35 U.S.C. 154(b) by 648 days.

(21) Appl. No.: 11/916,538

(22) PCT Filed: May 31, 2006

(86) PCT No.: PCT/EP2006/005195
§ 371 (c)(1),
(2), (4) Date: Sep. 3, 2008

(87) PCT Pub. No.: WO2006/131251
PCT Pub. Date: Dec. 14, 2006

(65) Prior Publication Data
US 2008/0314288 A1 Dec. 25, 2008

(30) Foreign Application Priority Data
Jun. 6, 2005 (DE) .......... 10 2005 025 933

(51) Int. Cl.
H01L 21/04 (2006.01)
H01L 21/38 (2006.01)
H01L 21/02 (2006.01)
H01L 21/316 (2006.01)
C09K 17/40 (2006.01)
C09K 17/02 (2006.01)

(52) U.S. Cl. ... 438/510; 438/558; 257/607; 106/287.17; 106/287.18; 106/287.29

(58) Field of Classification Search ............ 106/287.17, 106/287.18, 287.29, 287.27; 117/86, 106, 117/89; 438/510, 780, 558; 257/607, 280, 257/347, 352
See application file for complete search history.

(56) References Cited

U.S. PATENT DOCUMENTS

| | | | |
|---|---|---|---|
| 1,985,424 A | 12/1934 | Piggott | |
| 2,016,962 A | 10/1935 | Flint | |
| 2,703,798 A | 3/1955 | Schwartz | |
| 3,676,338 A | 7/1972 | Fries et al. | |
| 3,676,340 A | 7/1972 | Berg et al. | |
| 5,766,371 A | 6/1998 | Bunch | |
| 6,695,903 B1 | 2/2004 | Kuebelbeck et al. | |
| 2002/0014611 A1 | 2/2002 | Taylor et al. | |

FOREIGN PATENT DOCUMENTS

| | | |
|---|---|---|
| DE | 3914131 A1 | 10/1990 |
| DE | 4326959 C2 | 8/1993 |
| DE | 4309567 A1 | 9/1994 |
| DE | 4400632 C1 | 3/1995 |
| EP | 0285768 A1 | 10/1988 |
| EP | 0693049 A1 | 1/1996 |
| EP | 1414082 A2 | 4/2004 |
| FR | 1580491 A | 9/1969 |
| JP | 58217598 A | 12/1983 |
| JP | 05326432 * | 12/1993 |
| JP | 09181009 * | 7/1997 |
| WO | 92 06152 A1 | 4/1992 |
| WO | 92 06153 A1 | 4/1992 |
| WO | 92 06154 A1 | 4/1992 |
| WO | 92 06155 A1 | 4/1992 |
| WO | 92 06156 A1 | 4/1992 |
| WO | 92 06157 A1 | 4/1992 |
| WO | 92 06158 A1 | 4/1992 |
| WO | 92 06159 A1 | 4/1992 |
| WO | 92 06160 A1 | 4/1992 |
| WO | 92 06161 A1 | 4/1992 |
| WO | 92 06162 A1 | 4/1992 |
| WO | 92 06164 A1 | 4/1992 |
| WO | 92 06170 A1 | 4/1992 |
| WO | 92 06171 A1 | 4/1992 |
| WO | 92 06172 A1 | 4/1992 |
| WO | 92 06984 A1 | 4/1992 |
| WO | 94 22800 A1 | 10/1994 |
| WO | 95 07731 A1 | 3/1995 |

OTHER PUBLICATIONS

Kelkenberg, H.: "Detergenzien auf Zuckerbasis", Tenside Surfactants Detergents 25, S. 8-13, 1988.
Patent Abstracts of Japan, vol. 2000, No. 19, Jun. 5, 2001 and JP 2001 053016 A (Toshiba Corp), Feb. 23, 2001.
Patent Abstracts of Japan, vol. 1997, No. 11, Nov. 28, 1997 and JP 09181009 A (Tokyo Ohka Kogyo Co. Ltd), Jul. 11, 1997.
Patent Abstracts of Japan, vol. 1997, No. 11, Nov. 28, 1997 and JP 09181010 A (Tokyo Ohka Kogyo Co. Ltd), Jul. 11, 1997.
Patent Abstracts of Japan, vol. 005, No. 198 (E-087), Dec. 16, 1981 and JP 56122125 A (Toshiba Corp), Sep. 25, 1981.
Patent Abstracts of Japan, vol. 015, No. 324 (C-0859), Aug. 19, 1991 and JP 03122098 A (Mitsubushu Materials Corp), May 24, 1991.

* cited by examiner

*Primary Examiner* — Ling Choi
*Assistant Examiner* — Monique Peets
(74) *Attorney, Agent, or Firm* — Heslin Rothenberg Farley & Mesiti P.C.

(57) ABSTRACT

A doping mixture for coating semiconductor substrates which are then subjected to a high temperature treatment to form a doped layer includes at least one p- or n-dopant, water and a mixture of two or more surfactants. At least one of the surfactants is nonionic. Also, provided are a method for producing such a doping mixture and the use thereof.

10 Claims, No Drawings

MIXTURE FOR DOPING SEMICONDUCTORS

CROSS REFERENCE TO RELATED APPLICATIONS

This application is a national stage filing under section 371 of International Application No. PCT/EP2006/005195, filed on May 31, 2006, and published in German on Dec. 14, 2006, as WO 2006/131251 and claims priority of German application No. 10 2005 025 933.2 filed on Jun. 6, 2005, the entire disclosure of these applications being hereby incorporated herein by reference.

BACKGROUND ART

The invention pertains to a doping mixture for coating of semiconductor substrates that are then fed to high temperature treatment to form a doped layer. The invention also concerns a method for production of such a doping mixture, as well as its use.

The conductivity of semiconductors is generally increased by the fact that foreign atoms with a slightly higher or lower valence than that of the semiconductor material are incorporated in its crystal structure. In principle, this method can be applied to all types of semiconductors, but it has gained particular significance in the field of doping of silicon-based semiconductors. If, for example, pentavalent phosphorus is introduced to a crystal lattice of silicon atoms, the phosphorus atom occupies a location in the crystal lattice in place of a silicon atom. Since phosphorus has five valence electrons and only four are required for bonding with its four neighboring silicon atoms, one electron is left without a fixed bond. This electron is available for current conduction without expenditure of energy. A material doped in this way is called n-doped and is n-conducting. The introduction of an atom with lower valence than that of the semiconductor leads accordingly to an electron deficit, which also leads to an increase in conductivity. Such materials are called p-doped and are p-conducting.

Diffusion of phosphorus in the silicon wafer during formation of emitters for solar cells frequently occurs in a furnace with a so-called inline transport system. The wafers are initially coated with a phosphorus-containing layer and then treated at temperatures in a range from about 800° C. to 1000° C. The phosphorus atoms diffuse at these high temperatures from the coating into the wafer and thus form the emitter structures. Although this so-called inline diffusion is widespread, there is still no predominant technique for depositing the phosphorus-containing layer on the wafer before the diffusion step.

Inline diffusion has many advantages over the still widespread and commonly used traditional $POCl_3$ process in the prior art. In the context of such a process, $POCl_3$ is ordinarily applied in a preparation appropriate for this as a layer to the wafer and then heat-treated in a quartz tubular furnace. The inline method has a large number of advantages relative to this conventional method. The wafer is moved less frequently, from which a reduced hazard of wafer breakage results. However, different shortcomings have thus far been attached to the inline method that hampered utilization of the efficiency that this method can offer.

An important step for efficiency of a doping method exists in applying the doping source to the semiconductor being doped. Some methods for exposing the semiconductor to a corresponding dopant are already used, for example, in the microelectronics industry. Examples of such methods are chemical vapor deposition (CVD), in which, for example, gaseous phosphorus (for example, phosphane or phosphine) is evaporated on a surface being doped. Spin-coating, in which a sol-gel (a solution that contains the phosphorus silicate polymer molecules dissolved or suspended in an organic solvent) mixed with a phosphorus compound is often applied to the surface being doped and this placed in rotation, so that the solution or suspension is uniformly distributed on the surface, is also used as a method for applying a dopant to a semiconductor surface.

Excellently uniform and pure phosphorus silicate glasses can be obtained with the CVD method, but performance of the method requires complex equipment and precise process control. Moreover, hazardous materials are often used. The described spin-coating method does represent a much simpler alternative, but the drawbacks of the method are far more serious than the simple execution. Thus, in the spin-coating method, only about 2 to 5% of the employed material is actually used on the semiconductor surface for doping. This drastically increases the cost of the process overall. There is also the risk that during spin-coating, small regions uncoated by dopant will remain, and this is a particular hazard in textured semiconductor surfaces.

As another possibility for application of a dopant to a semiconductor surface, the screen-printing method was already used more than 20 years ago. This method has the advantage that formation of selected emitters is possible, in particular, based on the high viscosity of the applied material. However, in this method, pressure is exerted on the wafer, so that the risk of wafer breakage is significantly increased. Moreover, the employed materials contain a large amount of organic ingredients that burn during drying and diffusion of the dopant. This produces the potential problem that the organic residues will adhere strongly to the semiconductor surface, so that they remain permanently on the surface. Dipping the wafers in a dopant solution, in which the wafers are positioned on a corresponding conveyor belt that passes through a corresponding dopant solution, are among additional possible methods for application of a dopant to semiconductor surfaces. Rolling of a paste or liquid containing the corresponding dopant with a roller, which enters into contact with the wafer with slight pressure, is also possible. A common feature of both methods is that the formation of a reproducible thin and uniform layer of dopant on the surface is connected with extraordinarily serious difficulties.

Various attempts have been made to apply a dopant by spray application to the semiconductor surface. However, this turned out to be extraordinarily difficult, because of the material properties of ordinary dopant mixtures, since generally a sufficiently homogeneous distribution of the dopant mixture on the semiconductor surface could not be achieved. Experiments with phosphoric acid as dopant involved, in particular, the use of phosphoric acid vapor on wafer surfaces that were held at room temperature. The use of hot phosphoric acid and phosphoric acid vapor, however, is extremely problematical, because of the strong corrosion caused by hot phosphoric acid. Deposition of phosphoric acid from aqueous solution, however, was only insufficient, because of the surface condition of the semiconductor surface. Application of aqueous solutions generally led to the formation of isolated drops on the surface, which did not permit uniform doping.

EP 1 414 082 A2 discloses the use of aqueous solutions with doping surfactants for doping of organic and inorganic semiconductors.

Consequently, there was a demand for a method, with which a dopant can be simply applied quickly and in automated fashion to semiconductor surfaces, especially the surface of wafers. In particular, there was a demand for a method that permits such application of a dopant with the least possible material loss and the most reproducible and uniform possible result.

BRIEF SUMMARY OF INVENTION

The underlying task of the present invention was therefore to provide a method for doping of semiconductors, in which a dopant can be applied to a semiconductor surface, while avoiding the drawbacks of the prior art. Another task underlying the invention was to provide a doping mixture that is distributed homogeneously on the semiconductor surface, permits a homogeneous concentration of dopant over the semiconductor surface, which is simple to apply, for example, by spray application, and can be conducted with the least possible economic expense.

The tasks underlying the invention are solved by a doping mixture, a method for production of such a doping mixture, a method for doping of semiconductors and the use of a doping mixture as described in the following text.

The object of the present invention is therefore a doping mixture for semiconductor doping, containing at least one p- or n-dopant for doping of a semiconductor surface, water and a mixture of two or more surfactants, at least one of the surfactants being a nonionic surfactant.

A doping mixture according to the invention contains as dopant at least one compound that is capable of forming a p- or n-doped semiconductor surface during corresponding thermal treatment. In principle, derivatives of phosphorus, arsenic and antimony, which, in the context of a doping mixture according to the invention, are suitable in a corresponding form for application onto a semiconductor surface, are suitable as dopants to achieve n-doping in silicon. Corresponding derivatives of boron, aluminum, gallium or indium are suitable, for example, to form a small p-doping.

A doping mixture according to the invention contains, in the context of another variant of the present invention, a phosphorus source, an arsenic source or an antimony source as dopant. In the context of a preferred variant of the present invention, a doping mixture according to the invention contains a phosphorus source as dopant.

Dopants, usable in the context of the present invention, should be of a condition that they are sufficiently soluble, on the one hand, in a doping mixture according to the invention, so that they can be applied as homogeneously as possible to the semiconductor surface, and, on the other hand, the corresponding dopants should be such that no premature adverse reaction with an ingredient of the doping mixture occurs in a manner that has disadvantageous effects on the doping process. In the context of another variant of the present invention, a dopant source is used that has at least a polarity high enough, in order to be soluble in a mixture with at least 10 wt. % water, and optionally an additional solvent miscible with water. In the context of another variant of the present invention, a dopant source is used that has a solubility in water at 23° C. of at least 0.5 g/L, for example, at least 1 g/L or 5 g/L.

In another variant of the present invention, a doping mixture according to the invention contains as dopant a water-soluble phosphorus source. For example, phosphoric acid or a corresponding phosphoric acid derivative, for example, an appropriate oligophosphoric acid or polyphosphoric acid, or a phosphoric acid ester, for example, phosphoric acid-bis(2-ethylhexyl)ester (HDEHP) or phosphoric acid mono- or dibutyl ester, or mixtures of two or more thereof, can be contained as dopant.

In addition to a corresponding dopant, a doping mixture according to the invention also contains water. Water is present, for example, in an amount within the doping mixture that is sufficient to keep the doping mixture overall in liquid form. In particular, a doping mixture according to the invention contains water in amounts sufficient to keep the doping mixture sprayable overall.

In addition to a dopant and water, a doping mixture according to the invention contains a mixture of two or more surfactants, at least one of the surfactants being a nonionic surfactant.

DETAILED DESCRIPTION

"Mixture of two or more surfactants" is understood, in the context of the present invention, to mean a surfactant mixture containing two different types of surfactant. A surfactant mixture according to the present text can therefore be referred to as a mixture, because the surfactants contained in the m mixture have a different chemical structure. If a surfactant mixture contains a surfactant that is prepared by a polymer synthesis reaction, for example, by alkoxylation, a surfactant must still not be referred to as a mixture, because it contains oligomers with a different chain length in the range that was produced by the polymer synthesis reaction. A surfactant mixture that contains surfactants with a chemically fundamental structure, but a different molecular weight, should only be referred to as a mixture, in the context of the present invention, if the molecular weight distribution of the surfactants in this mixture is at least bimodal. Such bimodality can be recognized, if, by appropriate measurement methods, especially gel permeation chromatograph (GPC), light scattering or osmometry, number average molecular weights can be determined that differ from each other by at least 100, preferably by at least 200 or by at least 500 molecular weight units.

However, it is preferred, in the context of the present invention, if a doping mixture according to the invention contains at least two surfactants that differ from each other in their chemical composition.

At least one of the surfactants, used in the context of a doping mixture according to the invention, is a nonionic surfactant. A nonionic surfactant is a compound that does have high polarity, at least in one part of the molecule, but no charge.

Nonionic surfactants, in the context of the present invention, are understood to mean fatty alcohol ethoxylates, alkylphenol ethoxylates, fatty amine ethoxylates, fatty acid ethoxylates, fatty acid ester ethoxylates, other alkoxylates, alkanolamides, sugar surfactants, amine oxides and other nonionic surfactants.

Alkyl- and alkenyloligoglycosides, fatty acid-N-alkylpolyhydroxyalkylamides, alcohol alkoxylates, alkoxylated carboxylic acid esters, preferably alkyl- and alkenyloligoglycosides, are suitable as nonionic surfactants in the context of the present invention.

Alkyl- and/or alkenyloligoglycosides represent known nonionic surfactants that have the formula (I)

$$RO(G)z \qquad (I),$$

in which R stands for an alkyl and/or alkenyl group with 4 to 22 carbon atoms, (G) for a sugar group with 5 or 6 carbon atoms and z for numbers from 1 to 10. They can be obtained according to the pertinent methods of preparative organic chemistry.

The alkyl- and/or alkenyloligoglycosides can be derived from aldoses or ketoses with 5 or 6 carbon atoms, preferably glucose. The preferred alkyl- and/or alkenyloligoglycosides are therefore alkyl- and/or alkenyloligoglycosides. The index number z in general formula (I) states the degree of oligomerization (DP), i.e., the distribution of mono- and oligoglycosides, and stands for a number between 1 and 10. Whereas p in the given compound must always be a whole number and here can mostly assume the value z=1 to 6, the value p for a specific alkenyloligoglycoside is an analytically determined mathematical quantity that generally represents a fraction.

Alkyl- and/or alkenyloligoglycosides with an average degree of oligomerization z from 1.1 to 4.0 are preferably used. From an application standpoint, those alkyl- and/or alkenyloligoglycosides, whose degree of oligomerization is less than 1.7, and especially between 1.2 and 1.6, are preferred. The alkyl- or alkenyl group can be derived from primary alcohols with 4 to 11, preferably 8 to 10 carbon atoms. Typical examples are butanol, caproic alcohol, caprylic alcohol, capric alcohol and undecyl alcohol, as well as their technical mixtures, as obtained, for example, during hydrogenation of technical fatty acid methyl esters or during hydrogenation of aldehydes from Roelen's oxosynthesis. Alkyloligoglycosides with a chain length of $C_8$-$C_{10}$ (DP=1 to 3), which occur as a precursor during separation of technical $C_8$-$C_{12}$ coconut fatty alcohol by distillation, as well as alkyloligoglycosides based on technical C9/11-, C12/13- and C12/15-oxo-alcohols (DP=1 to 3), are preferred.

The technical oxo-alcohols from the Shell Company, marketed under the names Dobanol® or Neodol®, are particularly preferred here. The alkyl or alkenyl group R can also be derived from primary alcohols with 12 to 22, preferably 12 to 18 carbon atoms. Typical examples are lauryl alcohol, myristyl alcohol, cetyl alcohol, palmoleyl alcohol, stearyl alcohol, isostearyl alcohol, oleyl alcohol, elaidyl alcohol, petroselinyl alcohol, arachidyl alcohol, gadoleyl alcohol, behenyl alcohol, erucyl alcohol, brassidyl alcohol, as well as their technical mixtures, which can be obtained as described above. Alkyloligoglycosides based on hydrogenated $C_{12/14}$-coconut- or palm kernel oil and $C_{12/14}$-fatty alcohol from coconut, palm kernel or palm oil with a DP of 1 to 3 are preferred.

Another class of appropriate nonionic surfactants that are used in the context of the present invention, either as only nonionic surfactant or in combination with other nonionic surfactants, are alkoxylated, preferably ethoxylated or ethoxylated and propoxylated fatty acid alkyl esters, preferably with 1 to 4 carbon atoms in the alkyl chain, especially fatty acid methyl esters, as described in Japanese Patent Application JP 58/217598 A1, or which are preferably prepared according to the method described in International Patent Application WO-A-90/13533 A1.

Nonionic surfactants of the type of amine oxides, for example, N-cocoalkyl-N,N-dimethylamine oxide and N-tallowalkyl-N,N-dihydroxyethylamine oxide, and the fatty acid alkanolamides, can also be suitable.

Suitable nonionic surfactants are also polyhydroxy fatty acid amides of formula (II)

$$R'\!\!-\!\!CO\!\!-\!\!N\!\!-\!\![Z] \quad\quad (II),$$
$$\phantom{R'\!\!-\!\!CO\!\!-\!\!N\!\!}|$$
$$\phantom{R'\!\!-\!\!CO\!\!-\!\!}R^1$$

in which R'CO stands for an aliphatic acyl group with 6 to 22 carbon atoms, $R^1$ for hydrogen, an alkyl or hydroxyalkyl group with 1 to 4 carbon atoms, and [Z] for a linear or branched polyhydroxyalkyl group with 3 to 10 carbon atoms and 3 to 10 hydroxyl groups. The polyhydroxy fatty acid amides are known substances that can be obtained ordinarily by reductive amination of a reducing sugar with ammonia, an alkylamine or an alkanolamine and subsequent acylation with a fatty acid, a fatty acid alkyl ester or a fatty acid chloride.

The group of polyhydroxy fatty acid amides also includes compounds of formula (III)

$$R^1\!\!-\!\!O\!\!-\!\!R^2$$
$$\phantom{R^1\!\!-\!\!O\!\!}|$$
$$R''\!\!=\!\!CO\!\!-\!\!N\!\!-\!\![Z], \quad\quad (III)$$

in which R'' stands for a linear or branched alkyl or alkenyl group with 7 to 12 carbon atoms, $R^2$ for a linear, branched or cyclic alkyl group or an aryl group with 2 to 8 carbon atoms and $R^3$ for a linear, branched or cyclic alkyl group or an aryl group or an oxyalkyl group with 1 to 8 carbon atoms, in which $C_{1-4}$-alkyl or phenyl groups are preferred, and [Z] stands for a linear polyhydroxyalkyl group, whose alkyl chain is substituted with at least two hydroxyl groups, or alkoxylated, preferably ethoxylated or propoxylated derivatives of this group. [Z] is preferably obtained by reductive amination of a reduced sugar, for example, glucose, fructose, maltose, lactose, galactose, mannose or xylose. The N-alkyoxy- or N-aryloxy-substituted compounds can then be converted according to the teachings of International Application WO-A-95/07331 by conversion with fatty acid methyl esters in the presence of an alkoxide as catalyst to the desired polyhydroxy fatty acid amide.

The polyhydroxy fatty acid amides are known substances that ordinarily can be obtained by reductive amination of a reducing sugar with an alkylamine or an alkanolamine and subsequent acylation with a fatty acid, fatty acid alkyl ester or a fatty acid chloride. With respect to the method for their production, U.S. Pat. No. 1,985,424, U.S. Pat. No. 2,016,962 and U.S. Pat. No. 2,703,798, as well as International Patent Application WO 92/06984 A1, are referred to. An overview of this subject by H. Kelkenberg can be found in Tens. Surf Deterg. 25, 8-13 (1988).

The use of fatty acid-N-alkylpolyhydroxyalkylamides is also the subject of a number of publications. Their use as thickeners, for example, is known from European Patent Application EP 0285768 A1 (Hüls). Aqueous detergent mixtures based on sulfates and/or sulfonates, nonionic surfactants and optionally soaps that contain fatty acid-N-alkylglucamides as foam regulators, are described in French Unexamined Patent Application FR 1580491 A (Henkel). Mixtures of short- and long-chain glucamides are described in German Patent DE 4400632 C1 (Henkel). The use of glucamides with longer alkyl groups as pseudoceramides in skin care agents and combinations of glucamides with protein hydrolyzates and cationic surfactants in hair care products is also reported in German Unexamined Patent Applications DE 4326959 A1 and DE 4309567 A1 (Henkel). Mixtures of fatty acid-N-alkylglucamides with anionic surfactants, surfactants with sulfate and/or sulfonate structure, ether carboxylic acids, ether sulfates, methyl ester sulfonates and nonionic surfactants are the object of International Patent Applications WO 92/06153 A1, WO 92/06156 A1, WO 92/06157 A1, WO 92/06158 A1, WO 92/06159 A1 and WO 92/06160 A1 (Proctor & Gamble). Use of these substances in a wide variety of detergents, rinsing and cleaning agents is described in International Patent Applications WO 92/06152 A1, WO 92/06154 A1, WO 92/06155 A1, WO 92/06161 A1, WO 92/06162 A1, WO 92/06164 A1, WO 92/06170 A1, WO 92/06171 A1 and WO 92/06172 A1 (Proctor & Gamble).

Alcohol ethoxylates are usable as nonionic surfactants. These are referred to as fatty alcohol or oxo-alcohol ethoxylates, depending on their production, and preferably have the formula (IV),

$$R'''\!-\!O(CH_2CH_2O)_nH \qquad (IV)$$

in which R''' stands for a linear or branched alkyl and/or alkenyl group with 6 to 22 carbon atoms and n for numbers from 1 to 50. Typical examples are the adducts of an average of 1 to 50, preferably 5 to 40, and especially 10 to 25 mol caproic alcohol, caprylic alcohol, 2-ethylhexyl alcohol, capric alcohol, lauryl alcohol, isotridecyl alcohol, myristyl alcohol, cetyl alcohol, palmoleyl alcohol, stearyl alcohol, isostearyl alcohol, oleyl alcohol, elaidyl alcohol, petroselinyl alcohol, arachidyl alcohol, gadoleyl alcohol, behenyl alcohol, erucyl alcohol and brassidyl alcohol, as well as their technical mixtures, which form during high-pressure hydrogenation of technical methyl esters based on fats and oils or aldehydes from Roelen's oxosynthesis, as well as the monomer fraction during dimerization of unsaturated fatty alcohols. Adducts of 10 to 40 mol ethylene oxide on technical fatty alcohols with 12 to 18 carbon atoms, like coconut, palm, palm kernel or tallow fatty alcohol, are preferred.

Alkoxylated carboxylic acid esters are also usable as nonionic surfactants. Such compounds are known from the prior art. Alkoxylated carboxylic acids are accessible by esterification of alkoxylated carboxylic acids with alcohols. According to the present invention, the compounds, however, are preferably prepared by conversion of carboxylic acid esters with alkylene oxides, using catalysts, especially using calcined hydrotalcite according to German Unexamined Patent Application DE 3914131 A1, which yields compounds with a restricted homolog distribution. According to this method, both carboxylic acids of monohydric alcohols and polyhydric alcohols can be alkoxylated. Alkoxylated carboxylic acid esters of monohydric alcohols, having the following general formula (V), are preferred according to the present invention, $$R^4CO(OAlk)_nOR^5 \qquad (V)$$

in which $R^4CO$ stands for an aliphatic acyl group, derived from a carboxylic acid OAlk for alkylene oxide, and $R^5$ for an aliphatic alkyl group, derived from a monohydric aliphatic alcohol. Alkoxylated carboxylic acids of formula (V), in which $R^4CO$ stands for an aliphatic acid group of 6 to 30, preferably 6 to 22, and especially 10 to 18 carbon atoms, OAlk for a $CH_2$—$CH_2O$, $CHCH_2CH_2O$ and/or $CH_n$—$CHCH_2O$ group, n stands for numbers from 1 to 30, on average, preferably 5 to 20, especially 10 to 15, and $R^5$ stands for an aliphatic alkyl group with 1 to 4, and preferably 1 and/or 2 carbon atoms, are particularly suitable. Preferred acyl groups are derived from carboxylic acids with 6 to 22 carbon atoms with natural or synthetic origin, especially linear, saturated and/or unsaturated fatty acids, including technical mixtures, as accessible by fat cleavage from animal and/or vegetable fats and oils, for example, coconut oil, palm kernel oil, palm oil, soybean oil, sunflower oil, rapeseed oil, cottonseed oil, fish oil, beef tallow and lard. Examples of such carboxylic acids are caproic acid, carpylic acid, 2-ethylhexanoic acid, capric acid, lauric acid, isotridecanoic acid, myristic acid, palmitic acid, palmitoleic acid, stearic acid, isostearic acid, oleic acid, elaidic acid, petroselinic acid, linoleic acid, linolenic acid, elaeostearic acid, arachidic acid, gadoleic acid, behenic acid and/or erucic acid. Preferred alkyl groups are derived from primary, aliphatic monofunctional alcohols with 1 to 4 carbon atoms that can be saturated and/or unsaturated. Examples of appropriate mono-alcohols are methanol, ethanol, propanol, as well as butanol, especially methanol.

OAlk stands for alkylene oxides, which are converted with the carboxylic acid esters and include ethylene oxide, propylene oxide and/or butylene oxide, preferably ethylene oxide and/or propylene oxide, especially ethylene oxide alone. Alkoxylated carboxylic acid esters of formula (V), in which OAlk stands for a $CH_2CH_2O$ group, and for numbers with an average of 10 to 15, and $R^5$ stands for a methyl group, are particularly suitable. Examples of such compounds are lauric acid methyl ester, coconut fatty acid methyl ester and tallow fatty acid methyl ester, alkoxylated with an average of 5, 7, 9 or 11 mol ethylene oxide. The nonionic surfactants can be used in amounts from 20 to 95, preferably 50 to 80 and especially 60 to 70—referred to the final concentration.

Hydroxy-Mixed Ethers

The hydroxy-mixed ethers (HME), also suitable as nonionic surfactants, represent known nonionic surfactants with nonsymmetric ether structure and polyalkylene glycol fractions, which are obtained, for example, by subjecting olefin epoxides with fatty alcohol polyglycol ethers to a ring opening reaction. Corresponding products and their use in the area of cleaning of hard surfaces are the object of European Patent EP 0693049 B1 and International Patent Application WO 94/22800 A1 (Oliv) and the documents mentioned there. The hydroxy-mixed ethers typically follow the general formula (VI)

$$R^6\!-\!CH)OH)\!-\!CHR^7O(CH_2CHR^8O)_nR^9$$

in which $R^6$ stands for a linear or branched alkyl group with 2 to 18, preferably 10 to 16 carbon atoms, $R^7$ for hydrogen or a linear or branched alkyl group with 2 to 18 carbon atoms, $R^8$ for hydrogen and methyl, $R^9$ for a linear or branched, alkyl and/or alkenyl group with 6 to 22, preferably 12 to 18 carbon atoms, and n for numbers from 1 to 50, preferably 2 to 25, especially 5 to 15, with the stipulation that the sum of the carbon atoms in groups $R^6$ and $R^7$ is at least 4, and preferably 12 to 18. As follows from the formula, the HME can be ring opening products, both of internal olefins ($R^7$ not equal to hydrogen) or terminal olefins ($R^6$ equal to hydrogen), in which the latter are preferred, in view of easier preparation and more advantageous application properties. The polar part of the molecule can also be a polyethylene glycol or polypropylene glycol chain; mixed chains of PE and PP units are also suitable, whether in statistical or block distribution. Typical examples are ring opening products of 1,2-hexene epoxide, 2,3-hexene epoxide, 1,2-octene epoxide, 2,3-octene epoxide, 3,4-octene epoxide, 1,2-decene epoxide, 2,3-decene epoxide, 3,4-decene epoxide, 4,5-decene epoxide, 1,2-dodecene epoxide, 2,3-dodecene epoxide, 3,4-dodecene epoxide, 4,5-dodecene epoxide, 5,6-dodecene epoxide, 1,2-tetradocene epoxide, 2,3-tetradecene epoxide, 3,4-tetradecene epoxide, 4,5-tetradecene epoxide, 5,6-tetradecene epoxide, 6,7-tetradecene epoxide, 1,2-hexadecene epoxide, 2,3-hexadecene epoxide, 3,4-hexadecene epoxide, 4,5-hexadecene epoxide, 5,6-hexadecene epoxide, 6,7-hexadecene epoxide, 7,8-hexadecene epoxide, 1,2-octadecene epoxide, 2,3-octadecene epoxide, 3,4-octadecene epoxide, 4,5-octadecene epoxide, 5,6-octadecene epoxide, 6,7-octadecene epoxide, 7,8-octadecene epoxide and 8,9-octadecene epoxide, as well as their mixtures with addition products of an average of 1 to 50, preferably 2 to 25, and especially 5 to 15 mol ethylene oxide and/or 1 to 10, preferably 2 to 8, and especially 3 to 5 mol propylene oxide to saturated and/or unsaturated primary alcohols with 6 to 22, preferably 12 to 18 carbon atoms, like caproic alcohol, caprylic alcohol, 2-ethylhexyl alcohol, capric alcohol, lauryl alcohol, isotridecyl alcohol, myristyl alcohol, cetyl alcohol, palmoleyl alcohol, stearyl alcohol, isostearyl alcohol, oleyl alcohol, elaidyl alcohol, petroselinyl alcohol, linolyl alcohol, linolenyl alcohol, elaeostearyl alcohol, arachidyl alcohol, gadoleyl alcohol, behenyl alcohol, erucyl alcohol and brassidyl alcohol, as well as their technical mixtures. Ordinarily, the HME are contained in the molded articles in amounts from 0.1 to 20, preferably 0.5 to 8, and especially 3 to 5 wt. %.

The nonionic surfactants that are particularly suitable in the context of the present invention are capable, in principle, of reducing surface tension in an aqueous system, and especially achieving low dynamic surface tension. Dynamic surface tension is understood to mean a reduction in surface tension as a function of time. Examples of commercially available corresponding surfactants are the surfactants marketed under the name Triton, for example, Triton BG, Triton CG, compounds of the Triton CF group, compounds of the Triton DF group, compounds of the Triton X-series, Triton-CA, Triton N-57 or Triton X-207. Compounds marketed under the name Triton are available from Dow Chemical Corporation, Midland, Mich. Nonionic surfactants are also suitable, for example, the compounds mentioned in US 2002/0014611 A1 in paragraph [0021].

In the context of another variant of the present invention, compounds from the Triton-DF series are used as nonionic surfactants, for example, Triton DF-16 or Triton DF-18.

Appropriate nonionic surfactants have an KLB-value of about 8 to about 14, especially about 10 to about 13, for example, about 11 to about 12. The pH-value of 5% aqueous solution of a corresponding surfactant preferably lies at about 5 to about 8, for example, about 6 to about 7. The equilibrium surface tension in dynes/cm is preferably about 25 to about 36, for example, about 26 to about 35 or about 27 to about 33 or about 28 to about 31 or about 29 to about 30. The dynamic surface tension in dynes/cm is about 40 to about 60, for example, about 42 to about 58 or about 44 to about 56 or about 46 to about 54 or about 48 to about 52. A value of about 300 to about 600, for example, about 350 to about 550 or about 440 to about 500, has turned out to be advantageous as critical micelle concentration (cmc) in distilled water at 25° C. Appropriate nonionic surfactants preferably have a low foam tendency and are stable in alkalis and alkaline solutions.

In addition to the aforementioned ingredients, a doping mixture according to the invention contains a fluorinated surfactant in the context of a preferred variant of the invention. Surfactants of the general formula $(R_F)_a(Q)_bZ$ are suitable as fluorinated surfactants, in which $R_f$ stands for a fluoroaliphatic group, a for 1 or 2, Q for a bonding group and b for 1.

$R_f$ generally stands for a fluorinated, preferably saturated, monovalent, non-aromatic group with at least 3 carbon atoms. The fluoroaliphatic group is preferably linearly branched or, if it has a sufficient number of carbon atoms or sufficient size, cyclic. Preferably, the group $R_f$ has complete fluorination, but it is also possible that the group still has hydrogen atoms or chlorine atoms. The latter is preferable, only if no more than 1 hydrogen atom or chlorine atom is contained in the group per 2 carbon atoms. Fluoroaliphatic groups, having about 1 to about 12 carbon atoms, are particularly suitable.

In the present case, Q stands for a compound group, which is mono- or polyvalent. For example, Q stands for an alkylene group, like methylene or ethylene, cyclohexylene, arylene or the like, or for combinations of such groups with molecule components that have heteroatoms, for example, oxy, thio, carbonyl, sulfonyl, sulfinyl, sulfonamido, carbonamido, ureylene, carbamato, imino and the like, as well as for combinations, like sulfonamidoalkylene, carbonamidoalkylene, oxyalkylene (for example, —C$_2$H$_4$OC$_2$H$_4$—), thiodialkylene (for example, —C$_2$H$_4$C$_2$H$_4$—) alkylenecarbamato and the like.

Z stands for a polar group that mediates water solubility or a molecule part, for example, sulfonate or sulfate and their metal salts, amino groups (for example, NH$_2$ or NHR, in which R stands for an alkyl group with 1 to 4 carbon atoms, for example, methyl, ethyl, isopropyl, n-propyl, n-butyl, isobutyl or tert-butyl), sulfoammonium or carboxyammonium groups, poly(oxyethylene), poly(oxypropylene), carboxylates, alkoxylates, phosphates and the like. For example, fluorinated surfactants can be used in the context of the present invention corresponding to the formula

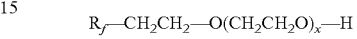

in which x stands for 2 to about 20 and $R_f$ stands for a perfluorinated hydrocarbon group of the structure CF$_3$—(CF$_2$CF$_2$)$_n$, in which n stands for a number from 2 to about 6. Such perfluorinated alkyl ethoxylates are commercially available, for example, under the names Zonyl SFO, Zonyl SFN and Zonyl SF300 (E.I. DuPont). Other appropriate fluorohydrocarbon surfactants include, among others, surfactants, like Zonyl SFK, an amphoteric fluorosurfactant from DuPont, Zonyl SF-62, an anionic fluorosurfactant from DuPont, FLURAD FC 170, a nonionic fluorosurfactant from 3M Company, or FC 123, an anionic fluorosurfactant from 3M Company, or L-18699A, a fluorinated surfactant from the 3M Company.

In the context of a preferred variant of the present invention, a doping mixture according to the invention contains a nonionic fluorinated surfactant.

In the coating and complexes in the coating, mixtures of ions of ionic fluorinated surfactants, preferably either mixtures of ions of cationic fluorinated surfactants or such anionic fluorinated surfactants, can naturally be used.

Anionic fluorinated surfactants include at least one hydrophobic group containing fluorine and at least one negative charge carrier.

Examples of such compounds are fluorinated carboxylic acids, as well as their salts, with inorganic or organic cations, fluorinated sulfonic acids, as well as their salts, with inorganic or organic cations, fluorinated organic sulfuric acids, as well as their salts, with inorganic or organic cations, fluorinated phosphonic, phosphonic or organophosphoric acids, as well as their salts, with inorganic or organic cations.

Preferred examples of these compounds classes are:
Perfluorocarboxylic acids and their preferably water-soluble salts, like perfluoroalkanoic acids, for example, perfluoroalkanoic acids of the formula CF$_3$(CF-i)$_n$—OOOH, in which n is preferably greater than or equal to 7;
Partially fluorinated carboxylic acids and carboxylic acid salts, like partially fluorinated alkanoic acids, partially fluorinated alkenoic acids, perfluoroalkoxyalkanoic acids, perfluoroalkylethyleneoxyalkanoic acids, perfluoroalkoxybenzoic acids, as well as partially fluorinated carboxylic acids containing sulfide, sulfo, carboxylic acid amide, hydroxy, oxo and/or ether groups and their salts, for example, lithium-3-[(1H,1H,2H,2H-fluoroalkyl(thio)]-propionate, Zonyl FSA©, DuPont);
Perfluorosulfonic acids and their preferably water-soluble salts, like perfluoroalkane sulfonic acids of the formula: CF$_3$(CFZ)$_m$—SO$_3$H, with m greater than or equal to 1;
Partially fluorinated sulfonic acids, as well as their preferably water-soluble salts, like partially fluorinated alkane sulfonic acids, for example, perfluoroalkylethanesulfonic acids, perfluoropropylethanesulfonic acids, partially fluorinated alkenesulfonic acids, as well as partially fluorinated sulfonic acids containing sulfide, carboxylic acid amide, hydroxy, oxo and/or ether groups, Fluorinated sulfoesters, for example, sulfosuccinic acid esters, perfluoroalkylsulfopropionates, perfluoroalkylsulfobutyrates and their salts for example, perfluoroalkylethylsulfonic acid ammonium salt, Zonyl TBS®, DuPont, sodium-[succinic acid diperfluoroalkyl-diester-2-sulfonate], Fluowet SB®, Clariant GmbH;

Fluorinated organic sulfuric acids and their salts, like perfluoroalkylated methylsulfates, fluorinated sulfatopoly (oxyethylene), perfluoropropoxylated sulfates and their salts;

Fluorinated phosphinic and phosphonic acids, as well as their preferably water-soluble salts, for example, Fluowet PL80©, Hoe S 2746, Clariant GmbH, fluorinated organic phosphoric acids and their salts, like perfluoroalkylethyl phosphoric acids. Mono- and bis-(fluoroalkyl)-(ethyl)-phosphoric acids. Perfluoroalkylphosphoric acids, fluorinated phosphate alkyl esters, for example, phosphoric acid perfluoroalkyl ester ammonium salt, Zonyl FSE® and Zonyl FSP®, DuPont.

In the context of a preferred variant of the present invention, the doping mixture according to the invention contains a non-fluorinated, nonionic surfactant. In the context of another variant of the present invention, a doping mixture according to the invention contains a nonionic, non-fluorinated surfactant and a fluorinated surfactant, for example, a nonionic, fluorinated surfactant.

A doping mixture according to the invention contains the dopant in an amount from 0.01 to 80 wt. %, for example, in an amount of about 0.05 to about 60 wt. % or about 0.1 to about 50 wt. % or about 0.5 to 40 wt. % or about 0.8 to about 30 wt. % or about 1.0 to about 20 wt. % or about 1.2 to 15 wt. % or about 1.5 to about 10 wt. % or about 1.5 to about 10 wt. % or about 1.8 to about 8 wt. %. The data in weight percent, refer to the weight of the entire dopant.

A doping mixture according to the invention contains a mixture of at least two surfactants in an amount of about 0.0011 to about 20 weight percent, for example, in an amount of about 0.005 to about 15 or an amount of about 0.1 to about 10 weight percent. If a doping mixture according to the invention contains a fluorinated surfactant, this fluorinated surfactant is present in an amount of about 0.0001 to about 5 weight percent, for example, in an amount of about 0.001 to about 2 weight percent or in an amount of about 0.01 to about 1 weight percent, for example, in an amount of about 0.05 to about 0.8 weight percent.

If a doping mixture according to the invention contains a non-fluorinated, nonionic surfactant, this non-fluorinated, nonionic surfactant, for example, is present in an amount of about 0.001 to about 10 weight percent, for example, in an amount from about 0.01 to about 8 weight percent or in an amount of about 0.05 to about 6 weight percent or in an amount of about 0.1 to about 5 weight percent or in an amount of about 0.5 to about 3 weight percent.

It has also turned out, in the context of the present invention, that it can be advantageous under certain circumstances, if fluorinated surfactants and nonionic, non-fluorinated surfactants, if both compound types are present in a doping mixture according to the invention, are present in a weight ratio of about 50:1 to about 1:500. Weight ratios from about 10:1 to about 1:100 or about 1:1 to about 1:50, especially about 1:2 to about 1:15, are particularly suitable.

A doping mixture according to the invention contains water. In principle, a doping mixture according to the invention can contain water in an amount that alone is not sufficient to place the doping mixture in a liquid state. In such a case, the doping mixture according to the invention, however, contains at least one additional water-miscible solvent, which overall ensures a liquid state or aggregation of the doping mixture at least a temperature within a range from about 0 to about 50° C. Preferably, a doping mixture according to the invention contains at least about 10 wt. %, for example, at least about 20 wt. % water. If the presence of water-miscible cosolvents is less desired or not desired at all, the percentage of water in a doping mixture according to the invention can also lie well above the mentioned values, for example, in at least about 30 weight percent, at least about 40 weight percent, at least about 50 weight percent, at least about 60 weight percent, at least about 70 weight percent, or a least about 80 weight percent. In many cases, it has proven advantageous, if the percentage of water is 90 weight percent or more, for example, at least about 95 weight percent.

Since a [doping mixture] according to the invention can be applied, in principle, at essentially any temperatures to the semiconductor surface, it is not necessarily essential, in the present context, that the doping mixture according to the invention be liquid at room temperature, i.e., at a temperature of about 23° C. It is essential, in the context of the present invention, that the doping mixture be liquid at the application temperature, i.e., at a temperature in the range from about 0 to 100° C., especially in the range from about 5 to about 50° C. or within a range from about 10 to about 40° C. The viscosity of a corresponding doping mixture preferably lies within a range that permits application by spraying.

A doping mixture according to the invention can contain one or more additives, in addition to the aforementioned compounds. Compounds that form a solvent mixture with water are then suitable as additives.

An appropriate solvent mixture then consists of water and at least one alcohol. In principle, any mixtures of water and one or more different alcohols can be used, if the other ingredients of the doping mixture can be dissolved in sufficient amount in the solvent mixture.

Preferred alcohols, in the context of the composition according to the invention, have a water solubility of at least 1 g/L, but preferably at least to about 10 or at least 30 g/L. Appropriate alcohols have 1 to about 60H groups, especially about 1, 2 or 3 free OH groups, which can be primary, secondary or tertiary, but preferably are primary or secondary. Linear or branched, saturated or unsaturated aliphatic or cyclic alcohols with 1 to about 10 carbon atoms are particularly suitable, especially linear or branched mono-, di- or triols with 1 to about 6 carbon atoms. In the context of the preferred variant of the present invention, ethanol, n-propanol, isopropanol, n-butanol, isobutanol, ethylene glycol, propylene glycol, butylene glycol, diethylene glycol, dipropylene glycol, dibutylene glycol, (2-methoxymethylethoxy)-propanol, glycerol or trimethylol propane or mixtures of two or more of the aforementioned alcohols are particularly suitable. Ether alcohols, obtained by etherification of one of the aforementioned diols or triols with one of the aforementioned mono-alcohols, are also suitable. The etherification products of ethylene glycol with ethanol, propanol or butanol, especially ethylene glycol monobutyl ether (butyl glycol), are then particularly suitable.

It has also been shown that the use of a mixture of at least one mono-alcohol and at least one ether alcohol leads to good results. Mixtures of ethanol, n-propanol or isopropanol or a mixture of two or more of them and ethylene glycol monobutyl ether, propylene glycol monopropyl ether or butylene glycol monoethyl ether or a mixture of two or more of them are suitable.

In some cases, the aforementioned compounds can already be ingredients of commercially available surfactants in the context of addition of such a surfactant in the production of a doping mixture according to the invention in the doping mixture.

A doping mixture according to the invention, in principle, can be prepared in any way by mixing of the individual ingredients. An object of the present invention is therefore also a method for preparation of a doping mixture according to the invention, in which at least one p- or n-dopant for doping of a semiconductor surface, water and two or more surfactants, in which at least one of the surfactants is a non-ionic surfactant, are mixed.

If a doping mixture according to the invention contains ingredients that permit dissolution of an essential ingredient of the doping mixture (for example, the dopant itself) or improve this dissolution, at least during use of the dopant mixture according to the invention, these ingredients can be added in appropriate sequence before the corresponding substance being dissolved.

Thus, a doping mixture according to the invention can contain dopants that are not soluble in water itself, or not sufficiently soluble. In such cases, it has worked to add additives to the doping mixture, like solubilizers. For example, these are alcohols that improve the solubility of the corresponding dopant. In such cases, addition of solubilizers can occur before addition of the dopant being dissolved. In some cases, however, it has proven advantageous, if, in the context of preparation of the doping mixture, addition of the solubilizer or a mixture of two or more solubilizers occurs before addition of the substance being dissolved, for example, before addition of the dopant.

A doping mixture according to the invention is suitable for doping of semiconductor surfaces. In the context of such doping, a semiconductor surface is initially supplied a doping mixture according to the invention. The object of the present invention is therefore also a semiconductor surface supplied a doping mixture according to the invention.

In the context of doping, a semiconductor surface is initially supplied the doping mixture according to the invention and treated in a subsequent step at elevated temperature. The object of the present invention is therefore also a method for doping of a semiconductor, in which a semiconductor surface is supplied at least one doping mixture according to the invention and the semiconductor surface then treated at elevated temperature.

With respect to supplying the semiconductor surface with a doping mixture according to the invention, any method is suitable, in principle, with which a doping mixture according to the invention can be applied to a semiconductor surface. Examples are dipping, brushing, rolling, doctor-coating, spin-coating, printing or application with a sponge or a sponge-like structure, for example, a roll, or spraying, for example, with ultrasonic or two-fluid nozzles, and those application methods that can be conducted with a liquid doping mixture.

It has turned out to be particularly advantageous, in the context of the present invention, if a method is used for application of the doping mixture according to the invention to semiconductor surfaces, which can be used with the least possible material loss and the highest possible accuracy with respect to achieving a homogeneous coating with the doping mixture in a largely automated method, especially an inline method. Spraying of the doping mixture on the semiconductor surface is particularly suitable in this context. In the context of a preferred variant of the present invention, supplying the semiconductor surface with the doping mixture therefore occurs by spraying.

In principle, any spray method, through which a doping mixture according to the invention can be applied to a semiconductor surface, is suitable. In the context of another variant of the present invention, a spray device is used for application of the doping mixture, which sprays, using ultrasound. Corresponding devices are known to one skilled in the art.

The use of a spray system, operating based on ultrasound, has different advantages. For example, the flow rates in an ultrasonic method can be set very low, so that thin doping mixture layers can be achieved. In addition, the ultrasonic method is characterized by the fact that very low drop velocities can be achieved and therefore shaping of the spray mist after discharge, for example, by external air jets, is possible. Such shaping of the spraying mist, however, increases the yield of the process, since almost the entire sprayed substance can be positioned accurately on the semiconductor surfaces. Because of this, so-called overspray is minimized and the homogeneity of the layer is improved.

In the context of another variant of the present invention, supply of the semiconductor surface therefore occurs by ultrasonic spraying.

Application of the doping mixture layer can occur on one side or, if two-sided doping is desired, on two sides. The semiconductor surface can then be dried. This can occur in a continuous dryer or in a special zone of a diffusion furnace. It is also possible in the context of the present invention that the drying step drops out.

Then, either directly after coating, after drying or optionally after interruption of the process, the coated semiconductor surface can be heat-treated in a corresponding diffusion furnace, for example, a continuous furnace or tubular furnace. In a continuous furnace, the disk-like semiconductor is transported in the horizontal position, in a tubular furnace the semiconductors are arranged vertically, for example, treated in wafer carriers.

Another object of the invention is the use of a mixture containing at least one p- or n-dopant for doping of a semiconductor surface, water and a mixture of two or more surfactants, at least one of the surfactants being a nonionic surfactant, to produce doped semiconductor surfaces.

The invention is further explained below by examples.

EXAMPLES

Silicon wafers were coated by ultrasonic spraying in an inline installation with a mixture of 3 wt. % concentrated phosphoric acid (85%), 1 wt. % Triton DF-16, 0.1 wt. % Zonyl FSH (50% in dipropylene glycol monomethyl ether) and water to 100 wt. %. The flow rate of the doping mixture was about 4 mL/min at a belt speed of about 600 mm/min during spraying. The wafer wetted with the dopant was fully coated, including the edge areas. No insular structures formed. After diffusion, a homogeneity of the emitter layer resistance of 2.2 Ω/sq. could be achieved (at an average of 46 Ω/sq.); after a $POCl_3$ reference process, it was 1.7 Ω/sq. After additional processing to solar cells, up to 14.9% efficiency could be achieved, versus 14.7% for a solar cell from a $POCl_3$ reference process. The results show the superior efficiency of the method according to the invention and the doping mixture according to the invention.

The invention claimed is:

1. Doping mixture for a semiconductor dopant, comprising at least one n-dopant for doping of a semiconductor surface, wherein the dopant contains a water-soluble phosphorus source, water and a mixture of two or more surfactants, at least one of the surfactants being a nonionic, non-fluorinated surfactant and at least another of the surfactants being a fluorinated surfactant, wherein the mixture contains nonionic, non-fluorinated surfactant in an amount from of 0.01 to 8 wt. % and fluorinated surfactant in an amount of 0.01 to 1 wt. %.

2. Doping mixture according to claim 1, wherein said doping mixture further comprises an arsenic source or an antimony source.

3. Doping mixture according to claim 1, containing as dopant phosphoric acid or a phosphoric acid derivative.

4. Doping mixture according to claim 1, containing a nonionic, fluorinated surfactant.

5. Doping mixture according to claim 1, containing the dopant in an amount from 0.01 to 80 wt. %, referred to the doping mixture.

6. Doping mixture according to claim 1, containing a fluorinated, nonionic surfactant in an amount from 0.05 to 0.8 wt. %.

7. Doping mixture according to claim 1, containing a non-fluorinated, nonionic surfactant in an amount from 0.05 to 6 wt. %.

8. Doping mixture according to claim 1, containing nonionic, fluorinated surfactants and nonionic, non-fluorinated surfactants in a weight ratio of 50:1 to 1:500.

9. Doping mixture according to claim 1, containing water in an amount of at least 10 wt. %.

10. Doping mixture according to claim 1, containing one or more additives.

* * * * *